United States Patent [19]

Miller et al.

[11] 4,410,823
[45] Oct. 18, 1983

[54] SURFACE ACOUSTIC WAVE DEVICE EMPLOYING REFLECTORS

[75] Inventors: Robert L. Miller, Urbana; Adrian DeVries, Mount Prospect, both of Ill.

[73] Assignee: Zenith Radio Corporation, Glenview, Ill.

[21] Appl. No.: 321,134

[22] Filed: Nov. 13, 1981

[51] Int. Cl.$^3$ .......................... H03H 9/25; H03H 9/64
[52] U.S. Cl. ............................... 310/313 D; 29/25.35; 333/194; 333/195
[58] Field of Search ........... 310/313 R, 313 B, 313 C, 310/313 D; 333/144, 150, 2, 154, 194; 264/24, 104; 333/140, 143, 147, 194, 195; 29/25.35

[56] References Cited

U.S. PATENT DOCUMENTS

| | | | |
|---|---|---|---|
| 3,071,841 | 1/1963 | Brussaard et al. | 29/25.35 |
| 3,713,036 | 1/1973 | Thomann | 333/150 |
| 3,886,504 | 5/1975 | Hartmann et al. | 310/313 D |
| 3,961,293 | 6/1976 | Hartmann et al. | 310/313 D |
| 4,037,175 | 7/1977 | Kansy et al. | 333/152 |

OTHER PUBLICATIONS

Miller, et al., "Filamentary Domain-Reversal Defects in Y-Z LiNbO$_3$", Ultrasonics Symposium, Boston, Sep. 26-28, 1979.

DeVries, et al., "Acoustic Effects of Filamentary Defects in Y-Z LiNbO$_3$", Ultrasonics Symposium, Boston, Sep. 26-28, 1979.

Primary Examiner—William H. Beha, Jr.
Assistant Examiner—D. L. Rebsch

[57] ABSTRACT

Electric domain reversals are arranged in parallel arrays on a piezoelectric ceramic substrate to form strong reflectors of surface acoustic waves in devices such as filters, resonators and the like. The domains are prepared by a poling process involving the use of a selective electrode pattern to which a high DC voltage is applied at a temperature above ambient but below the Curie temperature of the substrate.

2 Claims, 7 Drawing Figures

SURFACE ACOUSTIC WAVE DEVICE EMPLOYING REFLECTORS

This invention relates to surface acoustic wave devices, commonly used as electronic signal processors.

BACKGROUND AND SUMMARY OF THE INVENTION

Interdigital transducers have made possible a number of useful surface acoustic wave devices such as filters, resonators, delay lines and the like. A pair of interdigital transducers at the input and output ends of a surface acoustic wave channel, for example, comprise an acoustic delay line useful in various known signal-processing applications. If the transducers are sufficiently frequency-selective, the delay line acts as a filter which is useful in communications applications.

But the efficiency of such devices is materially reduced if the transducer which generates the acoustic signal sends only half of its acoustic output in the direction of the receiving transducer. The balance of the acoustic energy is transmitted in the opposite direction and is therefore wasted. If this oppositely directed energy is strongly reflected back to the receiving transducer in phase with the forward wave, a large increase in the efficiency of the device results. Similar considerations apply to the acoustic energy which leaks through the receiving transducer. A half power loss represents 3 dB; and since this happens at each of the two transducers, the total loss is 6 dB.

A surface wave acoustic resonator comprises a transducer which is both sender and receiver, located within a resonant cavity that is defined by a pair of opposed acoustic reflectors. The efficiency of the device is heavily dependent upon the efficiency of the reflectors, because they determine how much of the acoustic standing wave is reflected back into the cavity at both ends.

The inefficiency of prior art reflectors, such as grooves or metal lines, forces a trade-off between reflectivity and bandwidth. If a phased array of grooves or metal lines is used as a reflector, a large number of them is required to develop a reflection of useful amplitude. But the larger the number of lines, the narrower is the bandwidth of the device, because a large number of lines can all reflect in phase only within a relatively narrow frequency range. In prior art devices, quite often the desired bandwidth is incompatible with a high reflection coefficient.

Piezoelectric materials are able to maintain remanent electric states at a microscopic (domain) level. It has been recently recognized that when adjacent domains are oppositely polarized, the domain boundary is a strong reflector of acoustic waves. See "Filamentary Domain-Reversal Defects in Y-Z LiNbO$_3$; Structure, Composition, and Visualization Techniques" by Miller, et al., and "Acoustic Effects of Filamentary Defects in Y-Z LiNbO$_3$" by de Vries, et al. Miller and de Vries are the present inventors; their papers were presented at the Ultrasonics Symposium in Boston, Sept. 26-28, 1979 and later published as part of the Proceedings thereof. Both of these papers regard such domain reversals as accidental defects which degrade the performance of surface wave acoustic devices when they occur; but the de Vries paper recognizes that "If reversed domains could be obtained in a reproducible way, insertion loss of filters could be drastically reduced while the filter would become smaller also." The prior art, however, seems not to have harnessed the reflective capability of domain reversals in a useful way.

According to this invention, remanent electric polarity reversals are distributed in a pattern which is useful as an effective surface acoustic wave reflector, with the result that both high efficiency and wide bandwidth can be achieved in acoustic devices such as delay lines, filters, resonators, and the like.

Such reflectors also make it possible to build smaller surface acoustic wave devices for a given level of reflectivity, and they lend themselves readily to phase compensation schemes for the reduction of triple transit reflections, a serious problem in intermediate frequency filters used for television reception.

The invention will now be described in detail in conjunction with the following drawings.

DETAILED DESCRIPTION OF THE PREFERRED EMBODIMENT

Figure 1:
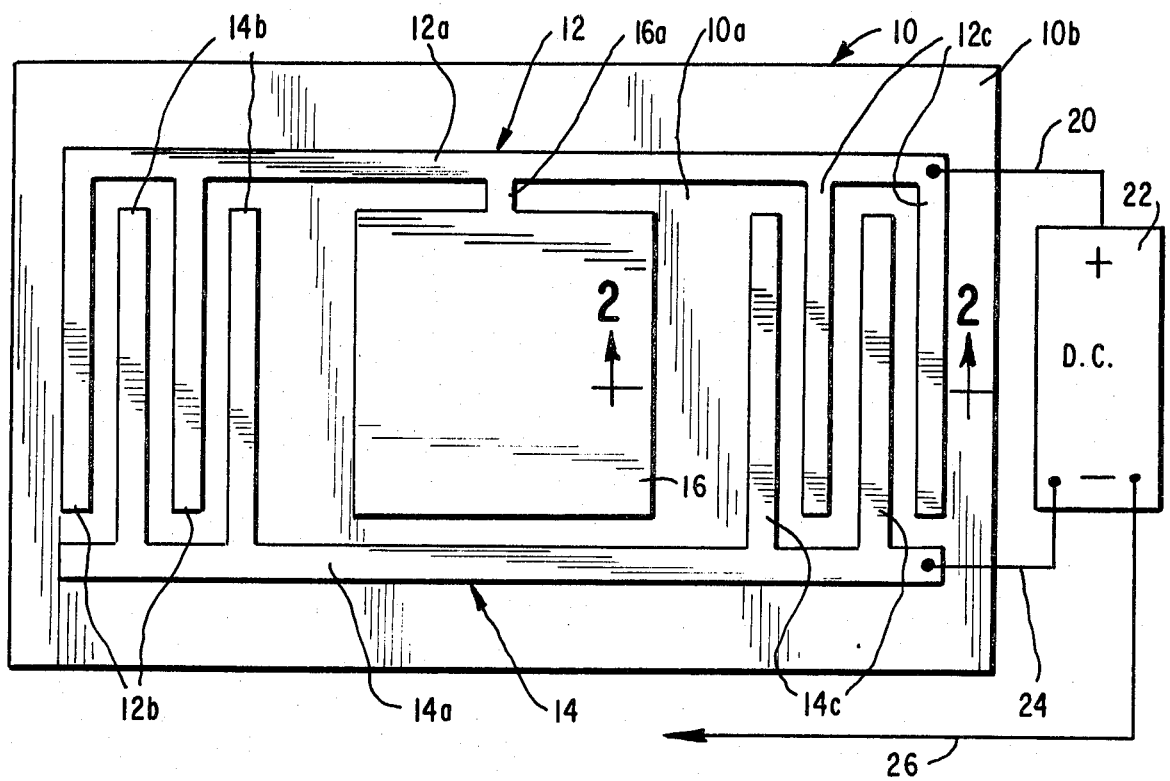
FIG. 1 is a top plan view of a piezoelectric substrate having poling electrodes thereon for the purpose of forming phased arrays of remanent electric states according to the method of this invention.

A slab 10 of piezoelectric material is chosen which is suitable for use as the substrate of a surface wave acoustic device (delay line, filter, resonator, etc.) incorporating one or more transducers and reflectors. But before the transducer or transducers are formed thereon, the slab 10 is subjected to a process of poling in order to form remanent electric fields in the crystal domains. At the present time, the best known material for this purpose is a hot-pressed and sintered lead zirconate titanate polycrystalline ceramic having the empirical formula $Pb_{0.95}Sr_{0.05}[(Ti_{0.475}Zr_{0.525})_{0.994}Cr_{0.003}Fe_{0.003}]O_3$. The chief advantage of this material for the present purpose is that it forms a remanent electric polarization more easily and/or at lower temperatures than some other piezoelectric materials which are commonly employed as substrates for surface acoustic wave devices.

Poling

This is a process conventionally employed for inducing piezoelectric properties in polycrystalline ceramic materials by orienting the axes of all the crystal domains in the same direction. It is customarily accomplished by applying a high voltage to the material at elevated temperatures. But for the purposes of this invention, instead of a simply uniform domain alignment, the electric poling process must be carried out in a selective pattern which corresponds to the desired geometry of the phased remanent polarization reversals. Thus a positive electrode 12 and a negative electrode 14 are laid down on one surface of the slab 10, preferably by conventional photolithographic techniques, in a selective pattern which includes bus bars and parallel, regularly spaced, linearly shaped fingers.

The positive electrode 12 includes a bus bar 12a and two spaced groups of fingers 12b and 12c, while the negative electrode 14 includes a bus bar 14a and two spaced groups of fingers 14b and 14c. In the first group, positive fingers 12b are interdigitated with negative fingers 14b, and in the second group positive fingers 12c are interdigitated with negative fingers 14c. These interdigitated, oppositely poled fingers cooperate to form the polarization reversals which serve as surface acoustic wave reflectors.

Between the "b" group of fingers and the "c" group of fingers is a central area 10a of substrate which must remain free of reflective polarity reversals, because it is reserved for one or more transducers when the final device is completed. In order to keep this central area free of polarity reversals, it is provided with a pair of broad blanket electrodes 16 and 18. Unlike the other portions of the poling electrodes, which are on only one face of the substrate 10, the blanket electrodes 16 and 18 are on opposite faces thereof. Thus, the blanket electrode 16, the bus bars 12a and 14a, and the interdigitated fingers 12b, 14b and 12c, 14c are all on an upper face 10b of slab 10; while the other blanket electrode 18 is on the lower face 10c thereof (see FIG. 2).

The two blanket electrodes 16 and 18 are located directly opposite each other, are congruent in size and shape, and are oppositely connected electrically. The upper blanket electrode 16 is connected to the positive bus bar 12a by a printed circuit lead 16a, and the bus bar in turn is connected by a wire lead 20 to the positive side of a D.C. source 22. A wire lead 24 connects the negative side of source 22 to the negative bus bar 14a, while another wire lead 26 (see FIGS. 1 and 2) connects another negative terminal to the bottom electrode 18. The choice of positive and negative connections is of course entirely arbitrary.

In a typical poling procedure, the D.C. source 22 is turned on and the substrate 10 is raised to an elevated temperature. The Curie temperature of the material depends upon the exact balance of zirconate and titanate, but is somewhere between 300° and 400° C. It is necessary to stay well below that level, otherwise the conductivity of the material becomes too high and there is a risk of damage to the slab 10. However, an above-ambient temperature is desired so that the remanent fields will be formed in response to the applied potential within a shorter period of time. Good results have been achieved when the material is held at 100° C. for about 30 minutes to one hour, with an applied field intensity of about 100 volts per 1/1000 of an inch. Since the interelectrode distance between the blanket electrodes 16 and 18 is larger than between fingers 12b and 14b or 12c and 14c, the two different negative terminals of power supply 22 must supply two different source voltage levels in order to maintain the required field intensity of 100 volts/mil.

After the poling process has been completed, the substrate 10 is allowed to cool to ambient temperature, the D.C. potential is turned off, and the wire leads 20, 24 and 26 are disconnected. The substrate 10 is then left with interior remanent electric fields as shown by the arrows 28 and 29 in FIG. 2. Because the oppositely connected interdigitated electrodes 12b, 14b and 12c, 14c were on the substrate surface 10b, the remanent polarization fields 28 are at and immediately below that surface. Thus, they are disposed directly in the path of any surface acoustic wave traversing that surface.

Figure 2:
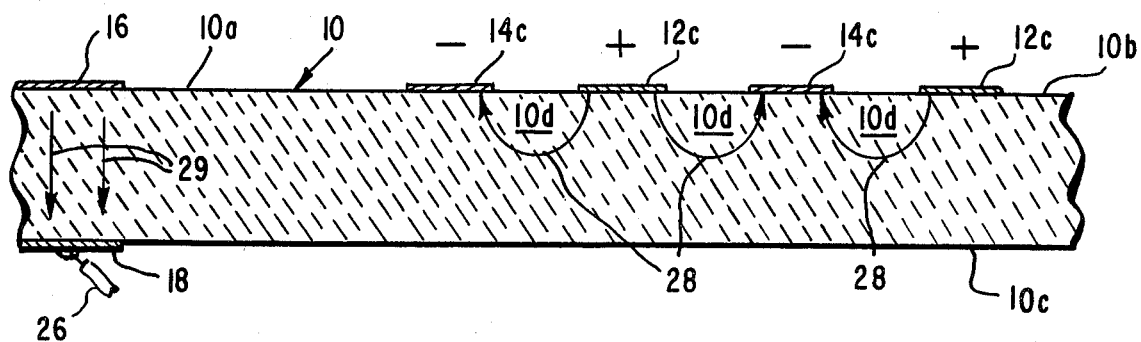
FIG. 2 is a fragmentary cross-sectional view of the substrate and electrodes in FIG. 1, taken along the lines 2—2, with arrows representing the remanent field vectors.

Each electric field vector 28 in FIG. 2 is pointed downwardly into the bulk of the substrate 10 below each positive finger 12b or c, and upwardly toward the surface 10b below each negative finger 14b or c. Thus, each substrate region 10d which is immediately below the surface 10b and flanked by a pair of oppositely poled fingers 12b, 14b or 12c, 14c finds itself half-encircled by one of the polarization arrows 28. As a result, each such region 10d contains a polarity reversal because it lies between the descending tail and the ascending head of the polarization vector. Consequently, these regions 10d are all remanent subsurface acoustic reflectors of high efficiency.

Because of the linear shape of the fingers 12b, c and 14b, c the polarity reversal regions 10d defined therebetween also have a substantially linear geometry. Moreover, they are parallel and regularly spaced from each other, because of the parallelism and regularity of the fingers. Thus, they form a phase-coherent array of acoustic reflectors with respect to any surface wave traveling at right angles thereto which has a wavelength equal to d/n, where d is the center-to-center distance between consecutive electrodes 12b, 14b, 12c or 14c of like polarity, and n is any positive integer. As stated in the de Vries, et al. paper cited above, the reflections from the opposite sides of a given domain are in phase with each other, unlike the reflections from the opposite edges of a metal finger, which are in phase opposition to each other.

The Final Device

The poling electrodes 12, 14 and 16 are not retained after the poling process has been completed. These elements are not part of the final device. The final device comprises a pair of acoustically coupled interdigital transducers 26b and 26c (FIG. 3) forming a surface acoustic wave delay line, filter, resonator or the like, flanked on opposite sides by a pair of efficient reflectors. One reflector, to the left of the left-hand transducer 26b, comprises a phase-coherent array of reflective domain reversals 10d immediately below the surface 10b, which, if desired, may be interspersed with and supplemented by a phase-coherent array of metal reflector fingers 22b, 24b upon the surface 10b. The other reflector, to the right of the right-hand transducer 26c, comprises a similar phase-coherent array of reflective domain reversals 10d and, optionally, a similar array of metal fingers 22c, 24c. If the final device is a resonator, there may be as few as one interdigital transducer formed in the central area 10a. In either case, the fingers of the transducer or transducers 26b and 26c in the central area 10a must be parallel to the reflectors 10d, 22b, 24b, 22c and 24c, and accurately spaced therefrom in order to preserve the necessary phase coherency therebetween.

Preferred Methods of Manufacture

The formation of the final device configuration (seen in FIG. 3) must be carefully coordinated with the poling process, because the fingers of the final device transducers 26b and 26c must be extremely precisely spaced, and aligned, with respect to the domain reversals 10d produced by a poling procedure. For this reason, the poling method described in connection with FIG. 1 may need to be replaced by one of the following methods which is capable of substantially greater accuracy.

Figure 3:
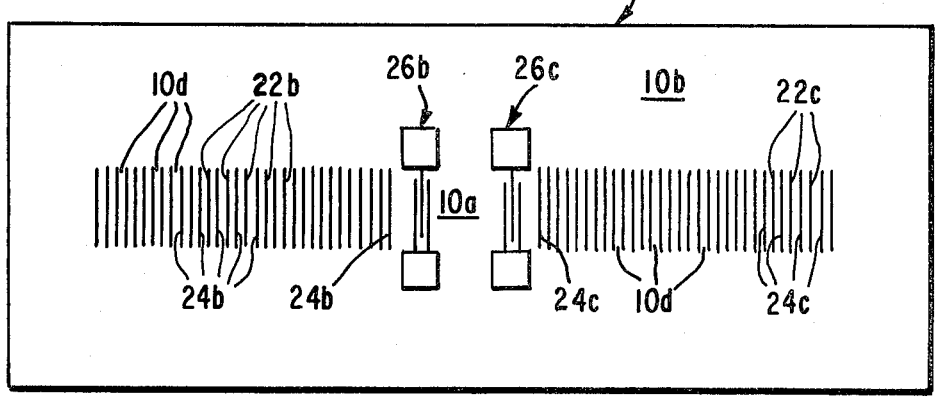
FIG. 3 is a top plan view of a delay line or filter in accordance with this invention.

In one method, the electrode pattern of FIG. 3 is laid down first, using standard photolithographic techniques. These electrodes may be formed of a relatively non-reactive metal, such as gold, with a chrome underlayer to improve adhesion to the substrate 10. Next, a broad cover of a more reactive metal, such as aluminum, is plated over the gold; and an etchant which removes aluminum but not gold is employed, along with a suitably shaped photoresist mask, to form the electrode configuration 12, 14, 16 of FIG. 4 in aluminum. The gold electrode configuration (FIG. 3) remains in place.

Figure 4:
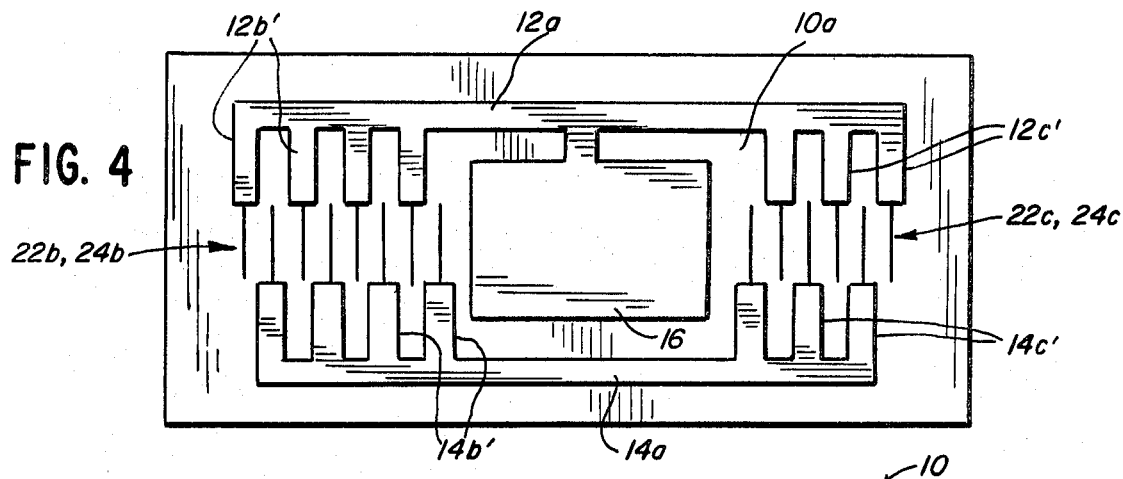
FIG. 4 is a top plan view of a piezoelectric substrate having an alternate poling electrode configuration thereon.

The gold transducer or transducers 26b and 26c underlie the aluminum blanket electrode 16 and are in direct electrical contact therewith, so that the entire area 10a is poled between bottom electrode 18 (FIG. 2) and the combination of gold layer 26b, c and aluminum layer 16. The aluminum fingers 12b', 12c' and 14b', 14c' in FIG. 4 are shorter than their correspondingly labeled counterparts 12b, c and 14b, c in FIG. 1; and are just long enough to make electrical contact with the extremities of the gold reflectors 22b, c and 24b, c respectively. Consequently, in the critical area, the actual poling is done by the gold reflectors 22b, c and 24b, c, which are accurately positioned relative to the fingers of transducers 26b, c because elements 22b, c and 24b, c were formed in the same photolithography step as elements 26b, c. In the critical area, which corresponds to the width (aperture) of transducers 26b, c (i.e., over the length of the fingers of transducers 26b, c), the poling is not done by elements 12b', 12c', 14b', 14c', which are less accurately registered because they were not laid down at the same time as elements 26b, c.

The poling voltages are connected to the poling electrodes, and the poling process is carried out as described above. The metal-to-metal contact of the aluminum fingers 12b', 12c', 14b', 14c' with the gold reflectors 22b, c and 24b, c, respectively, causes the respective poling voltages to be applied to the gold reflectors; and the metal-to-metal contact of the aluminum top layer 16 with the gold underlayer 26b, c insures that the appropriate poling voltage will be applied throughout area 10a.

The aluminum fingers 12b', 12c', 14b', 14c' are quite a bit wider than their respective gold reflectors 22b, c and 24b, c. As a result, there is a generous tolerance for misregistration between the gold and aluminum layers, without loss of electrical contact between aluminum elements 12b', 12c', 14b', 14c' and respective gold elements 22b, c and 24b, c. Consequently, the accurately registered gold elements can be reliably supplied with poling voltages by the less accurately registered aluminum elements.

Subsequently, the aluminum elements depicted in FIG. 4 are entirely etched away, leaving only the gold elements depicted in FIG. 3, plus the domain reversals 10d.

Figure 5:
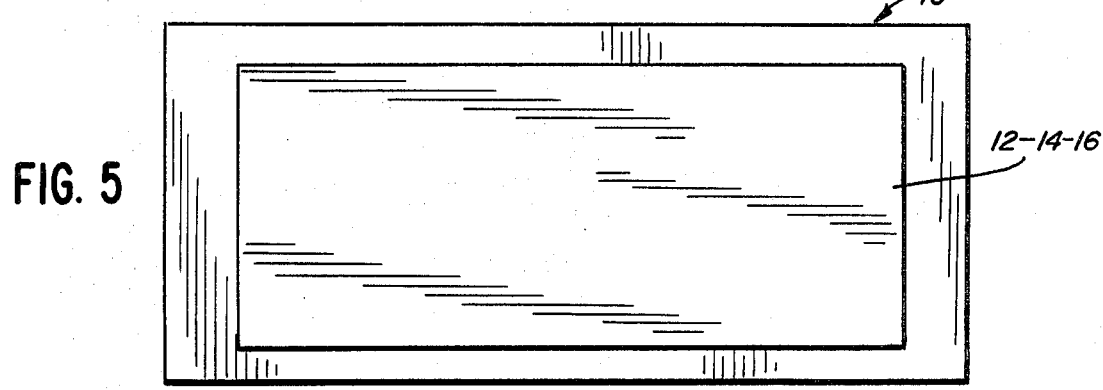
FIGS. 5-7 are top plan views of a piezoelectric substrate having poling electrodes thereon, and illustrating three successive poling electrode configurations employed in another alternate poling technique.
Figure 6:
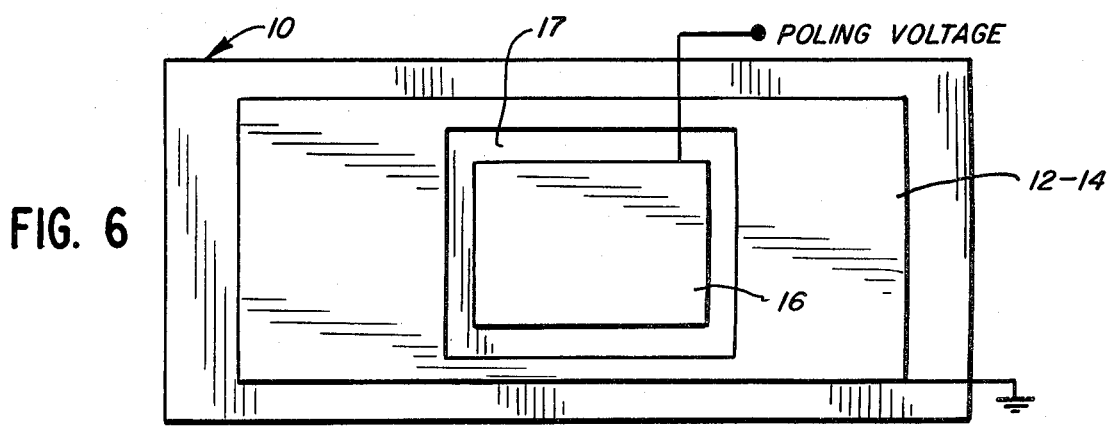

In another precision poling method, a continuous metal layer 12-14-16 (FIG. 5) is deposited directly over a bare area of substrate 10 large enough to include poling electrodes 12, 14 and 16. Then an area 17 (FIG. 6) is etched away to electrically separate poling electrode 16 of FIG. 1 from the remaining metallized area 12-14. Poling is then carried out by connecting suitable poling voltages only to electrodes 16 and 18 (FIGS. 1, 2 and 6), but not to the metallized area 12-14. The latter is connected, instead, to ground (as indicated schematically in FIG. 6) so as to prevent poling of all substrate areas beyond the central area 10a covered by electrode 16. Thus, at a time prior to formation of the transducer or transducers 26b, c, any inaccuracy of poling registration in the peripheral areas of substrate surface 10b is avoided by simply not doing any poling at all in such areas.

Figure 7:
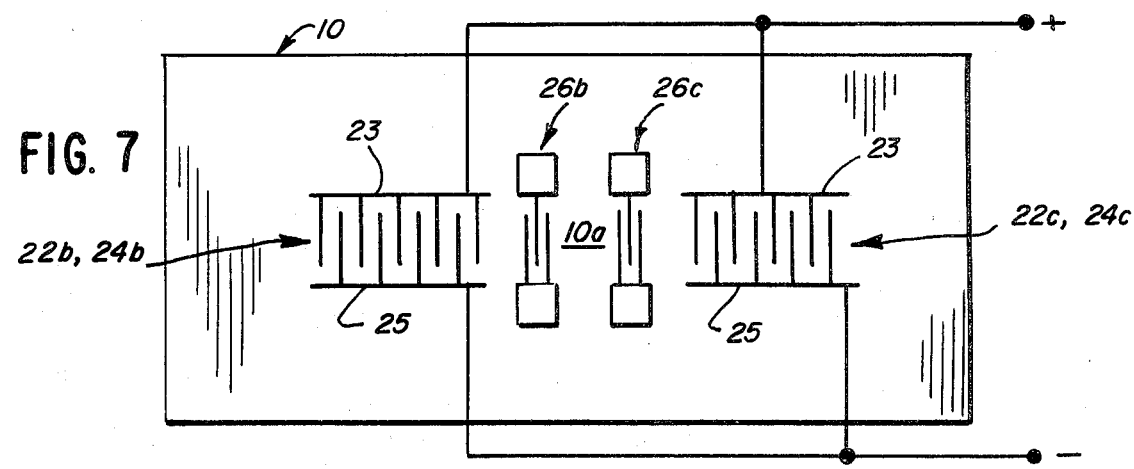

Subsequently, the metallized configurations 12-14 and 16 are both etched away by means of a photolithographic procedure which simultaneously forms the transducers or transducers 26b, c together with the reflectors 22b, c and 24b, c; so that the latter are accurately registered with the transducer fingers. At the same time, bus bars 23 and 25 (FIG. 7) are also formed, and connected to opposite pairs of reflectors 22b, c and 24b, c. Then a second poling procedure is undertaken, in which opposite poling voltages are connected to respective bus bars 23 and 25. This causes reflectors 22b, c and 24b, c to create the desired domain reversals 10d, which are then as accurately registered as the reflectors which create them. The bus bars 23 and 25 may thereafter simply be left in place or can be etched away in a subsequent process.

Final Device Characteristics

The left-hand reflector of the device seen in FIG. 3 captures a large share of any acoustic energy which is emitted in the backward direction by transducer 26b, and reflects it back toward the transducers where it can be used. It also captures a large share of any acoustic energy coming toward transducer 26b, but which leaks through transducer 26b; and this energy is also reflected back toward the transducers where it can be used. The right-hand reflector serves a similar purpose with respect to transducer 26c. In the case of a resonator, area 10a comprises a resonant cavity, and the two reflectors tend to keep the acoustic energy bouncing back and forth between them to set up a standing wave within the cavity which interacts with the transducer or transducers therein.

Experiments show that a domain reversal may attain a reflection efficiency as high as 12%, which is far superior to prior art reflectors such as grooves or metal fingers. The latter, for example, have a reflectivity of only about 2% on a material such as lithium niobate. The phase-coherent array geometry causes all the reflections of the individual domain reversals to add constructively, yielding a high efficiency total reflection (aided, in the device of FIG. 3, by the reflections from the phased arrays of metal fingers 22b, 24b and 22c, 24c). Since losses of 3 dB at each transducer 26b and 26c are prevented, a 6 dB improvement in insertion loss results when a full set of domain-reversal reflectors is used in a filter. If the same total reflection level were to be accomplished with metal fingers alone, a much larger number of individual reflectors would be required, resulting in a substantial narrowing of the frequency bandwidth of the device.

Thus, the invention makes possible wider bandwidths and/or more efficient and/or smaller size resonators, filters, delay lines, etc.; and it also provides a way of constructing more efficient triple transit phase compensation reflectors in such devices.

In some applications, the art has recognized that it is desirable to taper the reflectively coefficient as a function of the distance of the reflectors from the transducer array. In a device according to the present invention, this can be accomplished by selectively eliminating some of the reflecting domain reversals 10d, or by selectively varying the width or spacing of the poling electrodes which form the domain reversals 10d, or by selectively varying the poling potential, all as a function of distance from the transducer array 26b, c.

The described embodiments represent the preferred form of the invention, but alternative embodiments may be imagined which would come within the novel teachings herein. Accordingly, these embodiments are to be considered as merely illustrative, and not as limiting the scope of the following claims.

The invention claimed is:

1. A resonant surface acoustic wave device comprising:

a substrate comprising piezoelectric ceramic material;

one or more surface acoustic wave transducers each disposed exclusively on only one selected surface of said substrate, and each comprising a pair of electrodes formed with substantially linear, parallel, and mutually interdigitated fingers, said electrodes all being disposed on said same substrate surface and adapted to be connected to opposite sides of an electrical circuit;

and at least two surface acoustic wave reflectors disposed on said same substrate surface on opposite sides of said transducer or transducers and acoustically coupled thereto, such reflectors being disposed exclusively at locations spaced apart from said transducer or transducers in directions parallel to said substrate surface and comprising a plurality of individual substantially linear reflector elements which are disposed substantially parallel to said transducer electrode fingers and spaced respective different distances from said fingers such that their respective surface acoustic reflections are substantially in phase with respect to a surface acoustic wave which is within a selected frequency range;

said reflector elements each comprising a remanent electric domain reversal which is formed in said piezoelectic ceramic material adjacent said same substrate surface.

2. A resonant surface acoustic wave device comprising:

a substrate comprising piezoelectric ceramic material;

two surface acoustic wave transducers each disposed exclusively on only one selected surface of said substrate, and each comprising a pair of electrodes formed with substantially linear, parallel, and mutually interdigitated fingers, said electrodes of both said transducers all being disposed on said same substrate surface and adapted to be connected to opposite sides of an electrical circuit;

and at least two surface acoustic wave reflectors disposed on said same substrate surface on opposite sides of both said transducers and acoustically coupled thereto, such reflectors being disposed exclusively at locations spaced apart from both said transducers in directions parallel to said substrate surface and comprising a plurality of individual substantially linear reflector elements which are disposed substantially parallel to said transducer electrode fingers and spaced respective different distances from said fingers such that their respective surface acoustic reflections are substantially in phase with respect to a surface acoustic wave traveling upon said surface within a selected frequency range;

said reflector elements each comprising a remanent electric domain reversal which is formed in said piezoelectric ceramic material adjacent said same substrate surface.

* * * * *